United States Patent [19]
Raber

[11] 3,973,184
[45] Aug. 3, 1976

[54] THERMOCOUPLE CIRCUIT DETECTOR FOR SIMULTANEOUS ANALOG TREND RECORDING AND ANALOG TO DIGITAL CONVERSION

[75] Inventor: Ervin T. Raber, Norristown, Pa.

[73] Assignee: Leeds & Northrup Company, North Wales, Pa.

[22] Filed: Jan. 27, 1975

[21] Appl. No.: 544,472

[52] U.S. Cl. .............................. 324/51; 340/253 B
[51] Int. Cl.² ......................................... G01R 31/02
[58] Field of Search .................. 324/51, 57 PS, 123, 324/140; 340/256, 248 P, 214, 253 B, 253 H, 253 N, 253 P; 73/343

[56] References Cited
UNITED STATES PATENTS

| | | | |
|---|---|---|---|
| 2,793,343 | 5/1957 | Wagner | 324/57 PS |
| 3,284,705 | 11/1966 | Dobson | 324/57 PS |
| 3,431,490 | 3/1969 | Kwap et al. | 324/123 R X |
| 3,468,164 | 9/1969 | Sutherland | 324/51 X |
| 3,486,499 | 12/1969 | Yen | 324/123 R X |
| 3,559,051 | 1/1971 | Mazurek | 324/51 |
| 3,590,370 | 6/1971 | Fleischer | 324/51 |
| 3,699,438 | 10/1972 | Webb | 324/66 |
| 3,713,020 | 1/1973 | Kohler | 324/51 |
| 3,760,265 | 9/1973 | Hutch | 324/51 |
| 3,812,303 | 5/1974 | Stewart | 324/51 X |

*Primary Examiner*—Gerard R. Strecker
*Attorney, Agent, or Firm*—Raymond F. MacKay

[57] ABSTRACT

An improved thermocouple circuit condition detector for use in a measuring system requiring simultaneous analog trend recording and analog to digital conversion is disclosed. For analog to digital conversion the circuit testing period must be very short to fit in the time interval between conversions. For analog trend recording there should be no interruption of the analog circuit during the testing period and there should be no analog errors introduced by the testing circuit. All of these requirements are achieved by a novel pulse comparison circuit wherein a pulse by way of a direct path is applied as one input to a differential amplifier while that same pulse by way of the input terminal of the measuring amplifier which is connected to the ungrounded thermocouple lead, is applied to the other input of the differential amplifier. The detector alternately checks for open circuit and short circuit conditions.

7 Claims, 6 Drawing Figures

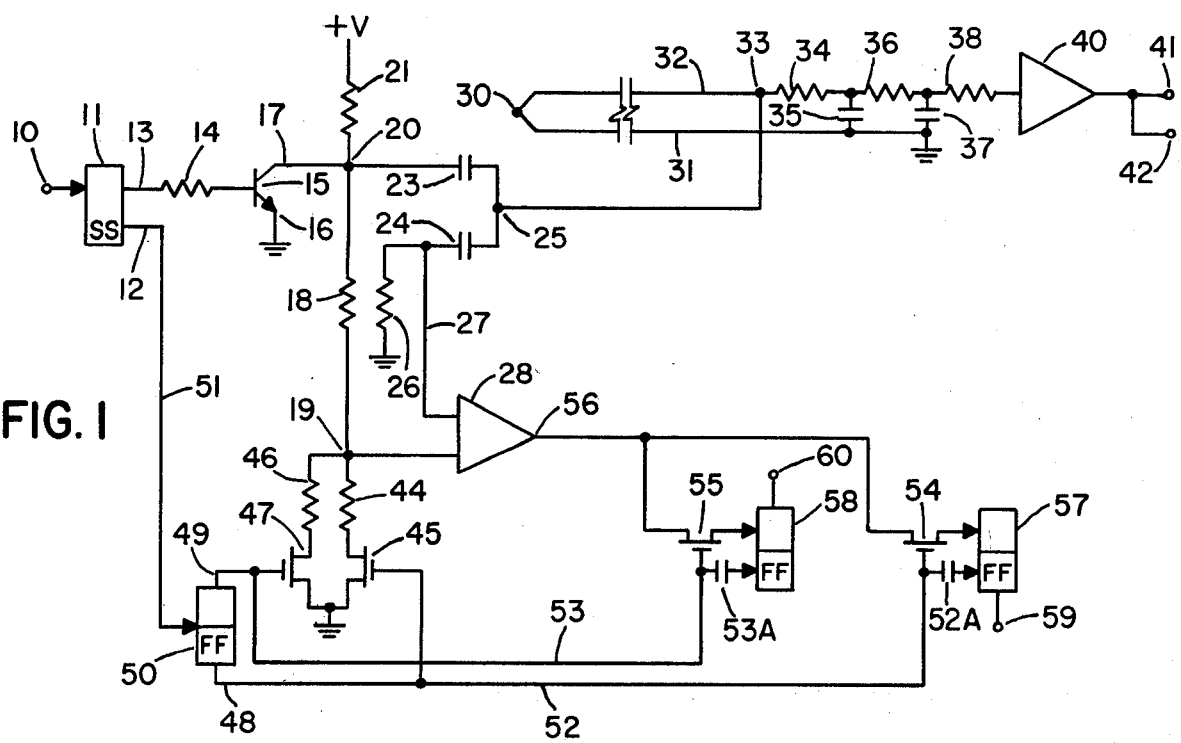
FIG. 1
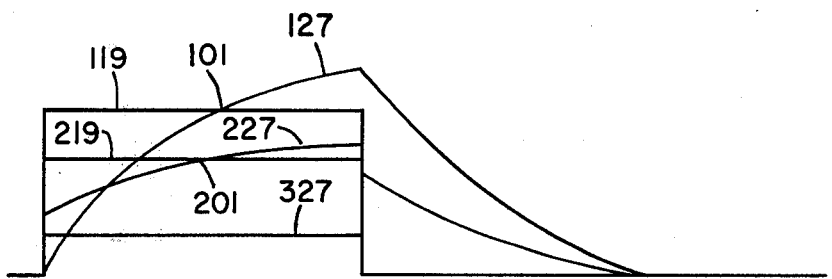
FIG. 2A
FIG. 2B
FIG. 2C
FIG. 2D
FIG. 2E 3,973,184

THERMOCOUPLE CIRCUIT DETECTOR FOR SIMULTANEOUS ANALOG TREND RECORDING AND ANALOG TO DIGITAL CONVERSION

BACKGROUND OF THE INVENTION

1. Field of the Invention

This invention is related to thermocouple temperature measuring systems and more particularly to the electronic circuitry for checking short circuit and open circuit thermocouple circuits.

2. Prior Art

U.S. Pat. No. 3,590,370 issued to D. W. Fleischer, assigned to the assignee of the present patent application, discloses a thermocouple open circuit detector wherein the thermocouple is disconnected from its normal measuring circuit for the testing period including the sending of a current pulse through the thermocouple and an inductive reactance in series circuit which builds up an inductive field and then measuring the decay of that field after the current pulse.

U.S. Pat. No. 3,760,265-F. S. Hutch discloses a thermocouple open circuit detector wherein the normal bucket charge transfer capacitor for transferring the thermocouple potential to the amplifier is used to transfer the test potential on to the thermocouple circuit for discharge.

U.S. Pat. No. 3,468,164-J. F. Sutherland discloses a thermocouple open circuit detector wherein a small voltage from an isolated power supply is applied to the two leads of the thermocouple under test, through high value resistors for potential reduction when the thermocouple is normal and relatively high reverse potential when the thermocouple is open.

SUMMARY OF THE INVENTION

An improved thermocouple circuit condition detector for use in a measuring system requiring simultaneous analog trend recording and analog to digital conversion is achieved by a novel pulse comparison circuit comprising: a pulse generator whose output has two paths, each leading to an input of a differential comparator amplifier; a first path is by way of an ungrounded terminal of the thermocouple under test; and a second path is by way of a predetermined attenuator; whereby for open circuit test, said comparator amplifier produces an output in one sense when said thermocouple is normal or short circuited and an output in another sense when said thermocouple is open; and for short circuit test, said comparator amplifier produces an output in said one sense when said thermocouple is short circuited and an output in said another sense when said thermocouple is normal or open.

BRIEF DESCRIPTION OF THE DRAWINGS

FIG. 1 shows a diagram of the preferred embodiment of the invention;

FIG. 2A is a timing diagram of the command pulse applied to terminal 10 of FIG. 1;

FIG. 2B is a timing diagram of the potential at junction 20 during the active state of single shot 11;

FIG. 2C is a timing diagram of the inputs to comparator amplifier 28;

FIG. 2D is a timing diagram of the output 56 for open circuit test; and

FIG. 2E is a timing diagram of the output 56 for a short circuit test.

DESCRIPTION OF THE PREFERRED EMBODIMENT

In FIG. 1 there is depicted a thermocouple measuring circuit which includes thermocouple 30 connected by way of leads 31, 32 filter resistors 34, 36 and 38 and filter capacitors 35 and 37 to the input circuit of a preamplifier 40. The outputs of the preamplifier 40 at terminals 41 and 42 may be connected to an analog trend recorder, an analog to digital converter or to control apparatus for controlling the temperature to which the thermocouple 30 is exposed.

In order to determine the condition of the thermocouple 30 while performing measuring and control functions a thermocouple circuit condition detector is connected at junction 33 to lead 32 of thermocouple 30.

In FIG. 1 a command pulse for initiating the thermocouple test cycle is applied to terminal 10 which is connected to the input of a source of pulses or pulse generator such as a monostable multivibrator or single shot 11 for triggering it into its active state. While in its active state output 13 is low and this low potential by way of resistor 14 applied to the base of transistor 15 renders it non-conductive. The emitter 16 of transistor 15 is connected to circuit common. The collector 17 of transistor 15 is connected to a junction point 20 and thence by way of capacitor 23 to another junction point 25. Junction point 25 of AC source of test pulses is connected to junction point 33 of thermocouple measuring circuit. The other thermocouple lead 31 is connected to circuit common. Resistor 21 is connected between junction point 20 and a positive source of supply +v. When single shot 11 is in its quiescent state output 13 is high and this high potential is applied by way of resistor 14 to the base of transistor 15 rendering it conductive causing junction point 20 to be at substantially circuit common potential. When single shot 11 is in its active state, output 13 is low and transistor 15 is rendered non-conductive releasing junction point 20 from its tie to substantially circuit common potential thus sending a pulse of charging current through capacitor 23, junction points 25, 33, lead wire 32, thermocouple 30 and lead wire 31 to circuit common. The current passing through junction point 25 has a parallel path to circuit common by way of an AC coupling circuit including capacitor 24 and resistor 26. However, the resistance value of resistor 26 is in the order of ten thousand times higher than the resistance of lead wires 31, 32 and thermocouple 30 in series circuit. An input of differential comparator amplifier 28 is connected to junction 25 by way of the D.C. blocking capacitor 24 and lead wire 27 for monitoring the change in signal level at junction 25. The other input of differential comparator amplifier 28 is connected to junction 19 and by way of resistor 18 to junction point 20 to directly receive the change in potential at junction point 20.

At junction 19 there are two alternative paths to circuit common. One is by way of resistor 44 and switching FET 45. The other is by way of resistor 46 and switching FET 47. Resistor 18 in series circuit with either resistor 44 or 46 forms a voltage divider network. The gate electrode of each of the switching FET's 45,47 are respectively connected to outputs 48,49 of a binary flipflop 50. The input to binary flipflop 50 is connected by lead 51 to output 12 of single shot 11. Successive activation of single shot 11 will cause the level at its output 12 to trigger binary flipflop 50 so that its outputs 48,49 alternately go to a high level which in turn will render switching FET's 45,47 to be alternately conductive.

Outputs 48,49 of binary flipflop 50 are also connected by way of leads 52,53 to the gate electrodes of switching FET's 54,55, respectively, to alternately switch the output 56 from comparator amplifier 28 to the set input of either flipflop 57 or flipflop 58. The reset inputs of flipflop 57,58 are connected respectively to leads 52 and 53 through coupling capacitors 52A and 53A. By these connections binary flipflop 50 programs the testing circuit under the control of pulses from single shot 11 to alternately perform the short circuit test and the open circuit test.

The operation of the invention described in FIG. 1 may be more clearly understood with the aid of timing diagrams shown in FIGS. 2A–2E. The command pulse applied to terminal 10 of FIG. 1 is shown in FIG. 2A. As previously explained, upon the application of the command pulse at terminal 10 the output 13 goes low rendering transistor 15 non-conductive, thus the potential at junction 20 rises as shown in FIG. 2B. It is to be noted that the potential at junction 20 stays high for the duration of the active state of single shot 11.

Under normal conditions the rise in potential at junction 20 will produce a rise in potential at junction 25. However, the rise in potential at junction 25 will depend on whether there is continuity from junction 25 to circuit common through the circuit path including lead 32, thermocouple 30 and lead 31.

In FIG. 2C curve 127 shows the potential change at junction 25 for an open circuit condition in the thermocouple 30 or in either of the leads 31,32. In fact curve 127 is determined principally by the RC time constant of resistor 34 and capacitor 35. Curve 227 shows a normal thermocouple 30 with normal connecting leads 31,32. Curve 327 shows the potential change when a short circuit condition exists between junction 33 and circuit common. The voltage response thus derived may be used for open, normal and short circuit detection.

For open circuit testing the output 48 of flipflop 50 is high rendering switching FET's 45 and 54 conductive and resetting flipflop 57 resulting in a "low" output at terminal 59. In FIG. 2C rectangular wave 119 represents the potential at junction 19 applied to one of the inputs of differential comparator amplifier 28 during the active state of single shot 11. Curve 127 represents the potential rise at junction 25 during the active state of single shot 11 for an open circuit thermocouple condition while curve 227 represents the potential rise for a normal thermocouple. The signal developed at junction 25 is essentially the same during the active state of single shot 11 as the signal applied by lead wire 27 to the other input of differential comparator amplifier 28. Therefore the height of rectangular wave 119 should be selected so that it is small enough to intersect curve 127 in the middle of the duration of the active state of single shot 11, such as at 101; but large enough that it does not intersect curve 227 which is representative of a normal thermocouple. The height of rectangular wave 119 is determined by the resistive divider network consisting of resistors 18 and 44. In a typical measuring system adapted to measure thermocouple voltages the following component values have been found to be suitable when a pulse duration of 0.25 milliseconds is used.

| | |
|---|---|
| Resistor 18 | 10,000 ohms |
| Resistor 44 | 511 ohms |
| Resistor 26 | 100,000 ohms |
| Capacitor 23 | 0.1 microfarad |
| Capacitor 24 | 0.1 microfarad |
| Resistors 34,36 | 680 ohms |
| Capacitors 35,37 | 22 microfarads |
| Resistor 38 | 2200 ohms |

At the beginning of the rectangular wave 119 the potential applied by junction 19 to the input of comparator amplifier 28 is greater than the potential on lead wire 27 and the output 56 of the amplifier 28 is negative and flipflop 57 remains in its reset state. If the condition of the thermocouple 30 is normal, the potential on line 27 follows curve 227 and the polarity of the output 56 remains negative and no signal appears at terminal 59. However, if the thermocouple is open circuited and the potential on lead wire 27 follows curve 127 the output 56 of comparator amplifier changes polarity at 101 to a positive signal and by way of switching FET 54 to set flipflop 57 to the alarm state producing an output at terminal 59 for connection to any suitable alarm indicating device. In the above description it is assumed the duration of the active state of single shot 11 is less than one order of magnitude of the time of response of filter network components 34–38 and amplifier 40 so that the output from single shot 11 represented by rectangular wave 119 is filtered out of amplifier 40.

For short circuit testing the output 49 of flipflop 50 is high rendering switching FET's 47 and 55 conductive and resetting flipflop 58 resulting in the output 60 being high. In FIG. 2C rectangular wave 219 represents the potential at junction 19 when the resistive divider network consisting of resistors 18 and 46 is effective during the active state of single shot 11. The height of rectangular wave 219 should be selected so that it intersects curve 227 in the middle of the duration of the active state of single shot 11, such as at 201. Rectangular wave 327 represents the potential at junction 25 and lead wire 27 when there is a short circuit condition between leads 31 and 32. Thus if the potential at junction 25 follows the curve 227, the output 56 of comparator amplifier changes polarity at 201 to a positive signal and by way of switching FET 55 sets flipflop 58 to the non-alarm state producing a zero output at terminal 60. If the potential at junction 25 follows rectangular wave 327 the output 56 remains negative and consequently flipflop 58 remains reset giving a high output at terminal 60 for connection to any alarm indicating device.

The principal advantage in having the capability in a single testing circuit of testing for open circuit and short circuit conditions is the reduction in ambiguity. If only an open circuit test is made then the potential at junction 25 following either curve 227 or rectangular wave 327 would test without alarm. If only a short circuit test is made then the potential at junction 25 following either curves 127 or 227 would test without alarm. It is only when both open circuit and short circuit tests are made and give no alarm that the thermocouple can be considered to be operating normally.

What is claimed is:

1. A thermocouple circuit condition detector for use at the input circuit of a thermocouple amplifier for amplifying the output of a thermocouple having one terminal of the thermocouple connected to the amplifier input and the other terminal of the thermocouple connected to circuit common and without removing said thermocouple circuit from said amplifier input, comprising:
- a differential input comparator amplifier having a pair of input terminals and an output terminal,
- a source of pulse signals having a pair of terminals, one of which is connected to circuit common,
- first means for coupling the other of said pair of terminals of said source of pulse signals to said one terminal of the thermocouple which is connected to the amplifier input and to one of said pair of input terminals of said differential comparator amplifier to produce an amplifier input signal to said differential comparator responsive to the condition of said thermocouple circuit, and
- second means for coupling a predetermined portion of the amplitude at said other of said pair of terminals of said source of pulse signals to the other of said pair of input terminals of said differential comparator amplifier to
- produce an output from said comparator amplifier in one sense when said thermocouple is normal and an output in another sense when said thermocouple is abnormal.

2. The detector of claim 1 wherein:
said source of pulse signals consists of a single shot having an active state whose duration is less than one order of magnitude of the time of response of said thermocouple amplifier, and
said second means comprises a voltage dividing network for deriving a first predetermined portion of the pulse amplitude at said other of said pair of terminals of said source of pulse signals substantially equal to the instantaneous signal amplitude of said one of said pair of input terminals of said differential comparator amplifier at least at the middle of the duration of the active state of said single shot when said thermocouple circuit is open.

3. The detector of claim 2 wherein:
said second means further comprises a second voltage dividing network for deriving a second predetermined portion of the pulse amplitude at the other of said pair of terminals of said source of pulse signals substantially equal to the instantaneous signal amplitude of said one of said pair of input terminals of said differential comparator amplifier at least at the middle of the duration of the active state of said single shot when said thermocouple circuit is normal, and
switching means under the control of said single shot for sequentially applying said first and said second predetermined portions of said pulse amplitude to said other input terminal of said differential comparator amplifier.

4. The detector of claim 1 wherein said first means comprises:
- a first D.C. isolating coupling capacitor connected between said other of said pair of terminals of said source of pulse signals and said one terminal of said thermocouple which is connected to the amplifier input, and
- a second D.C. isolating coupling capacitor connected between said one terminal of said thermocouple and said one of said pair of input terminals of said differential comparator amplifier.

5. The method of detecting electrical abnormalties in a thermocouple circuit including long connecting leads, one of which is connected to the input of an amplifier and the other of which is connected to circuit common, comprising the steps of:
- applying a pulse to the junction of said thermocouple lead and said amplifier input, of duration less than one order of magnitude of the time of response of said amplifier,
- comparing the instantaneous potential of said junction with a pulse amplitude which is greater than the instantaneous amplitude of said junction of a normal thermocouple circuit for the duration of said pulse and which is less than the instantaneous amplitude of said junction of an open circuit thermocouple circuit for substantially half of the duration of said pulse, and
- comparing the instantaneous potential of said junction with a pulse amplitude which is greater than the instantaneous amplitude of said junction of a short circuited thermocouple circuit for the duration of said pulse and which is less than the instantaneous amplitude of said junction of a normal thermocouple circuit for substantially half of the duration of said pulse.

6. A thermocouple circuit condition detector for use at the input circuit of a thermocouple amplifier having an input filter network and having one terminal of a thermocouple circuit connected to a first input terminal of said thermocouple amplifier and the other terminal of said thermocouple circuit connected to circuit common and to the second input terminal of said thermocouple amplifier comprising:
- an A.C. source of test pulses for producing a voltage pulse of short duration relative to the response time of said input filter,
- a first coupling circuit connected from said source of test pulses to said first input terminal of said thermocouple amplifier,
- an A.C. differential comparator amplifier having first and second input terminals and an output terminal,
- a second coupling circuit connected from said first input terminal of said thermocouple amplifier to said first input terminal of said comparator amplifier,
- a voltage divider network connected between said source of test pulses and said second input terminal of said comparator amplifier to apply thereto a voltage signal of magnitude at all times during the duration of said test pulse, greater than the potential developed at said first terminal of said comparator amplifier, when said thermocouple is normal and through at least part of the duration of said test pulse less than the potential developed at said first terminal of said comparator amplifier, when said thermocouple is open circuited, and
- a circuit condition indicator connected to the output of said comparator amplifier to provide an indication of an output circuit condition of said thermocouple when the potential applied to said first input terminal exceeds the potential applied to said second input terminal of said comparator amplifier.

7. A thermocouple circuit condition detector for use at the input circuit of a thermocouple amplifier having an input filter network and having one terminal of a thermocouple circuit connected to a first input terminal of said thermocouple amplifier input filter network and the other terminal of said thermocouple circuit connected to circuit common and to the second input terminal of said thermocouple amplifier input filter network comprising:
- a source of test pulses for producing a voltage pulse of short duration relative to the response time of said input filter,
- an A.C. coupling circuit connected from said source of test pulses to said first input terminal of said thermocouple amplifier input filter network to produce during the application of each of said test pulses a circuit condition voltage at said terminal that increases exponentially to a first value if said thermocouple circuit is open and to a second value that is smaller than said first value if said thermocouple circuit is normal,
- a voltage divider network having its input connected to said source of test pulses to produce an output voltage less than said first value and greater than said second value, and
- means for comparing said circuit condition voltage and the output of said voltage divider network and producing an open circuit signal when said circuit condition voltage exceeds said output voltage from said voltage divider network.

* * * * *